United States Patent [19]
Bruccoleri et al.

[11] Patent Number: 5,654,675
[45] Date of Patent: Aug. 5, 1997

[54] FULLY INTEGRABLE PHASE LOCKED LOOP WITH LOW JITTER

[75] Inventors: Melchiorre Bruccoleri, Genoa; Gianfranco Vai; Salvatore Portaluri, both of Pavia; Marco Demicheli, Binago, all of Italy

[73] Assignee: SGS-Thomson Microelectronics S.r.l., Agrate Brianza, Italy

[21] Appl. No.: 611,831

[22] Filed: Mar. 6, 1996

[30] Foreign Application Priority Data

Mar. 7, 1995 [EP] European Pat. Off. .............. 95830082

[51] Int. Cl.⁶ ......................... H03L 7/099; H03L 7/107
[52] U.S. Cl. ................................. 331/17; 331/25
[58] Field of Search ............................. 331/17, 25

[56] References Cited

U.S. PATENT DOCUMENTS

| | | | |
|---|---|---|---|
| 5,319,320 | 6/1994 | Abe et al. | 331/1 A |
| 5,369,376 | 11/1994 | Leblebicioglu | 331/8 |
| 5,495,512 | 2/1996 | Kovacs et al. | 331/17 |

FOREIGN PATENT DOCUMENTS

A-0 595 632  5/1994  European Pat. Off. .

OTHER PUBLICATIONS

Proceedings of the IEEE 1992 Custom Integrated Circuits Conference, May 3, 1992, Boston, pp. 24.2.1–24.2.5. Reza Shariadoust, et al. "A Low Jitter 5 MHz to 180 MHz Clock Synthesizer for Video Graphics".

*Primary Examiner*—Siegfried H. Grimm
*Attorney, Agent, or Firm*—Wolf, Greenfield & Sacks, P.C.; James H. Morris

[57] ABSTRACT

A fully integrated, phase locked loop (PLL) having improved jitter characteristics uses the same digital/analog converter (DAC) that is normally used to control the time constant of the low pass loop filter to control the value of a capacitance connected between the output of a voltage-to-current converting input stage of the voltage controlled oscillator and ground. The capacitance introduces a third pole in the loop's transfer function. In this way, the separation in the frequency domain between the zero and the third pole of the transfer function is kept constant; thus, the damping factor remains constant while the $\omega_0$ of the PLL is varied.

29 Claims, 3 Drawing Sheets

FULLY INTEGRABLE PHASE LOCKED LOOP WITH LOW JITTER

BACKGROUND OF THE INVENTION

1. Field of the Invention

The present invention relates to a fully integrable phase locked loop (PLL) particularly suited for applications that require an increased short term stability (low jitter).

The invention is particularly useful for generating a programmable reference frequency in order to maintain a constant density of data stored in the read/write "channels" of hard disks, or for implementing a phase separation of data (data separator PLL), or the like.

2. Discussion of Related Art

The functional block diagram of a phase locked loop (PLL) is depicted in FIG. 1.

Basically, the circuit includes a phase detector 10 for monitoring the phase difference between two signals, a charge pump circuit 12, a low pass loop filter 14, a voltage controlled oscillator (VCO) 16, and a phase control feedback network (1/N COUNTER) 18.

An analysis of the frequency characteristic of a PLL such as that shown in FIG. 1 may be based on the corresponding linear block diagram depicted in FIG. 2.

In the above mentioned applications, the transfer function F(s) of the low pass loop filter 14 is commonly of the following type:

$$F(s) = \frac{1 + sCR}{s(C_1 + C + sCC_1R)}$$

corresponding to the transfer function of a passive network, such as that shown in FIG. 3, which is often constructed outside the integrated circuit.

Referring to FIG. 3, the capacitances C1, which are functionally connected between the two nodes 34 and 36 of the low pass filter and a common ground node 38 of the circuit, introduce a third pole in the transfer function of the PLL. By an appropriate sizing, for example $C \approx 10C_1$, the transfer function of the low pass loop filter may be simplified as follows:

$$F(s) = \frac{1 + sCR}{sC}$$

By taking into account the above simplified expression, the open loop transfer function of the entire PLL may be written as follows:

$$H(s) = \frac{\theta_{out}}{\theta_e} = \frac{k_d \cdot k_{vco}}{N \cdot C} \cdot \frac{(1 + sCR)}{s^2}$$

The open loop gain characteristic of such a PLL, from which stability and ability to respond to eventual phase errors may be analyzed, is shown in FIG. 4. The presence of the third pole $p_3$ generated by the capacitances C1 is clearly recognizable in the diagram of FIG. 4.

As may be observed from the diagram of FIG. 4, the position of the zero $1/\tau$ and of the third pole $p_3$ markedly condition the functioning of the PLL system.

It should be noted also, especially for the type of application mentioned above, that $\omega_0$ should be adjustable while, at the same time, the damping factor $\xi$ should be kept constant.

In order to satisfy this important requirement, $1/\tau$ and $p_3$ should be sufficiently spaced from each other in the frequency domain in order to ensure a damping factor $\xi$ of sufficient value (typically not less than 0.707).

On the other hand, the position of the pole $p_3$ should not be excessively distant from $1/\tau$ because the loop must retain a good rejection capability of high frequency disturbances in order to optimize the short term stability characteristic (minimize jitter).

In known circuits, it is difficult to reconcile these contrasting requirements in an optimum way and, generally, these conditions imply a definite limitation on the circuit's ability to minimize jitter. This is extremely critical when the capacitances are external to the chip because of the presence of noise coming from the supply rails on the metal frame on which the chip is mounted. On the other hand, even in known circuits made in a completely integrated form, the ability to appropriately filter high frequency disturbances remains limited.

SUMMARY OF THE INVENTION

It has now been found, and represents an object of the present invention, a way to produce a third pole $p_3$ in the transfer function of a phase locked loop that overcomes the limitations and drawbacks of known circuits and markedly suppresses noise to the advantage of a further reduction of jitter. This is achieved by implementing an effective tracking between the $1/\tau$ zero and the third pole $p_3$ so as to make their separation in the frequency domain practically insensitive to process spread, thus permitting the changing of the value of $\omega_0$ while keeping the damping factor $\xi$ constant.

According to one aspect of the present invention, a third pole $p_3$ is created by the use of a capacitance connected between the output of a voltage-to-current converting input stage of the VCO and a common ground node of the circuit, and the value of the capacitance is controlled by the use of same digital/analog converter that is normally used to control the time constant $\tau$ of the low pass loop filter.

According to another aspect of the invention, an oscillator circuit is disclosed comprising a low pass filter and a voltage controlled oscillator. A pole is created internal to the voltage controlled oscillator and the frequency of the pole is controlled by using a time constant controller, which also controls a time constant of the low pass filter. According to an additional aspect, the circuit element that establishes the pole within the voltage controlled oscillator of the oscillator circuit also filters signals within the oscillator. And according to yet another aspect, the frequency of the pole is controlled so that it substantially tracks the frequency of a zero in the transfer function of the circuit established by a time constant in the low pass filter.

According to yet another aspect of the invention, a phase detector, a low pass filter, and a voltage controlled oscillator are coupled together, and feedback is provided from the voltage controlled oscillator to the phase detector. A circuit element establishing a pole at a certain frequency has its value controlled by a time constant controller, which also controls a time constant within the low pass filter. And according to another aspect, the pole frequency of the phase lock loop is controlled so that it substantially tracks a zero frequency established by the time constant in the low pass filter.

According to another aspect, the voltage controlled oscillator has a voltage-to-current converter input stage, and a capacitance is coupled between the output of this input stage and common ground. According to yet another aspect, a charge pump amplifies a signal from the phase detector. Also, according to another aspect, the value of the capacitance is controlled so that the pole created by it substantially tracks a zero generated in the transfer function by the time constant in the low pass filter.

BRIEF DESCRIPTION OF THE DRAWINGS

The different aspects and advantages of the invention will be more easily understood through the following description of an important embodiment, having a purely illustrative and non-limiting purpose, and by referring to the annexed drawings, wherein.

DETAILED DESCRIPTION

Figure 1:
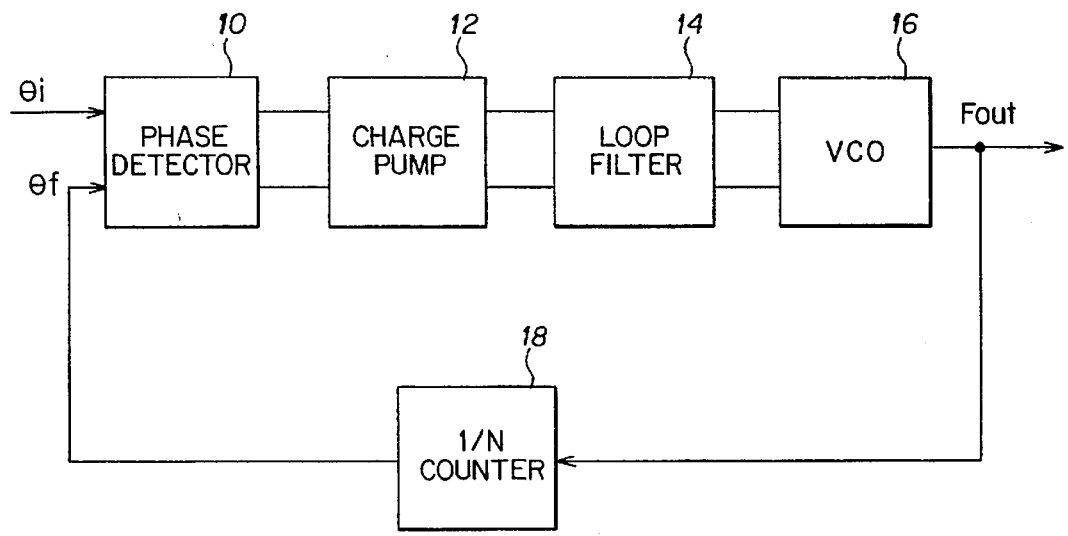
FIG. 1 as mentioned above, shows a typical block diagram of a PLL.
Figure 2:
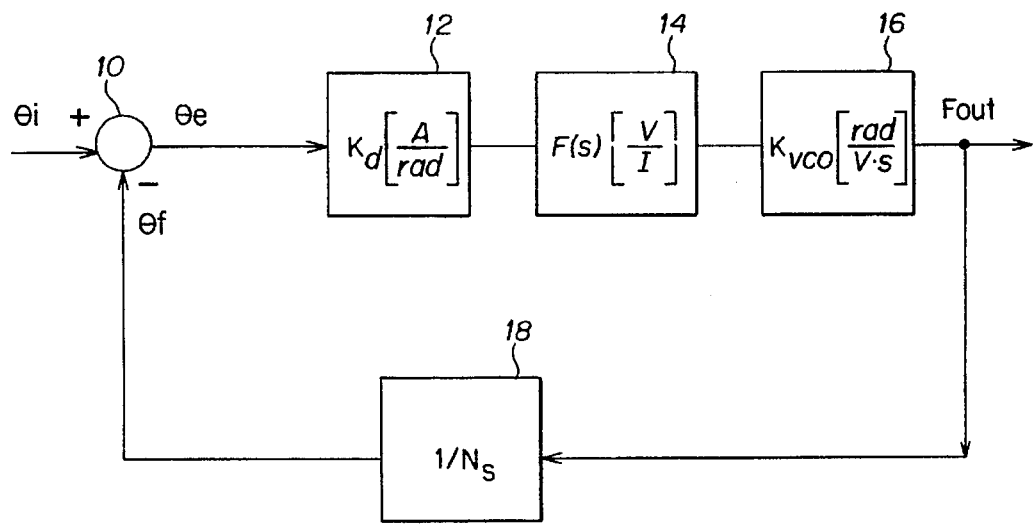
FIG. 2 as mentioned above, represents a linear block diagram of a PLL.
Figure 3:
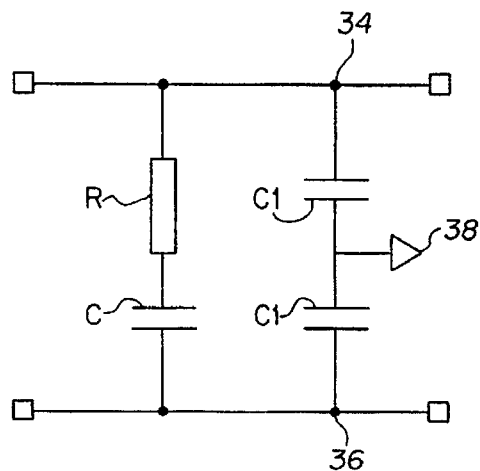
FIG. 3 as mentioned above, is the circuit diagram of a passive network implementing a low pass loop filter and producing a third pole $p_3$.
Figure 4:
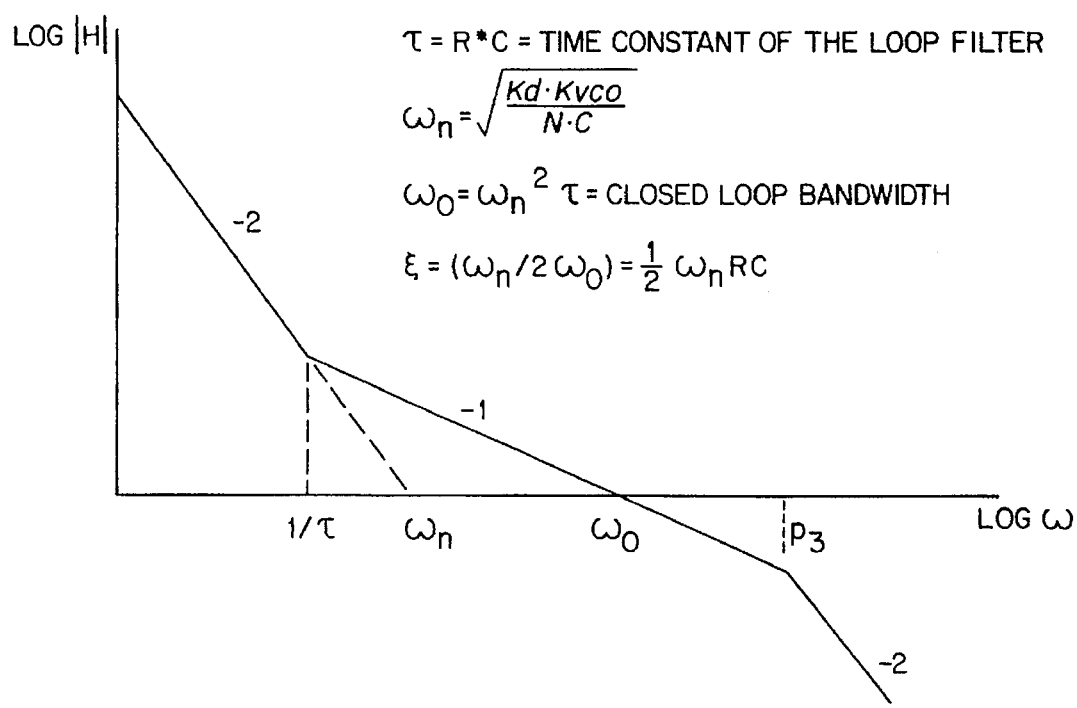
FIG. 4 as mentioned above, shows the frequency response characteristic of a PLL utilizing a low pass filter such as that depicted in FIG. 3.
Figure 5:
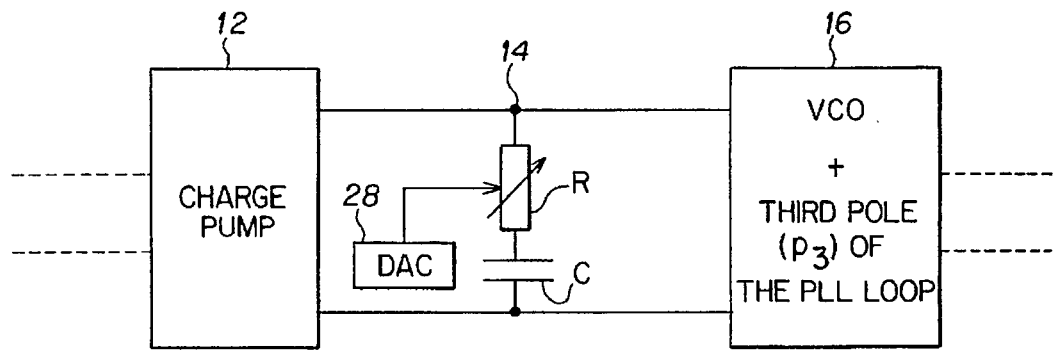
FIG. 5 is a partial block diagram of a fully integrated low pass loop filter.
Figure 6:
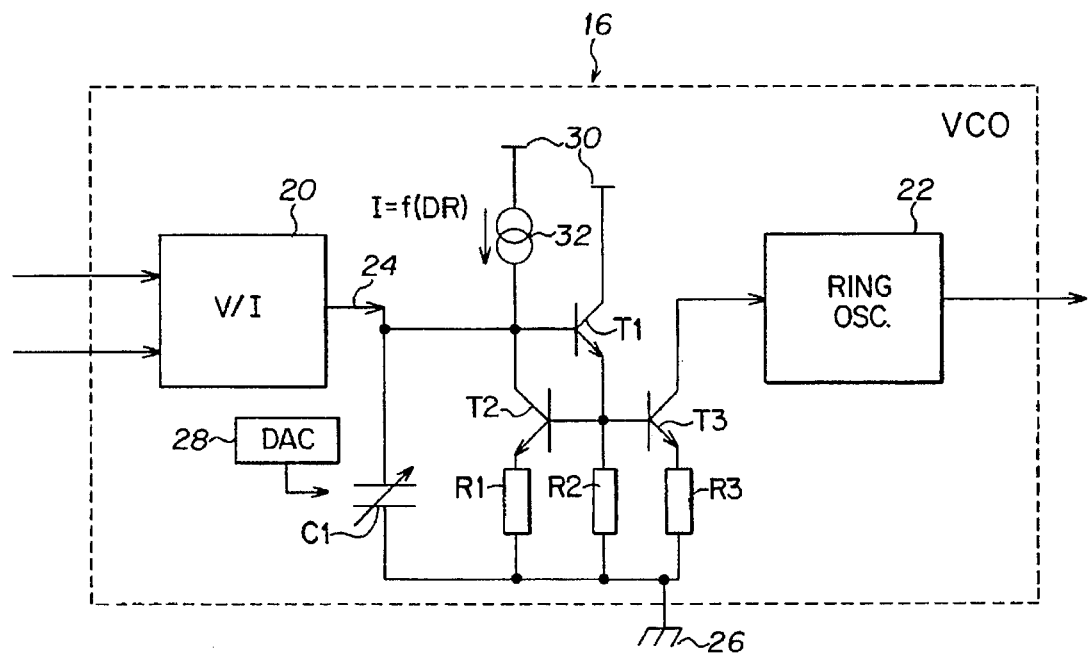
FIG. 6 shows a VCO circuit incorporating means for generating a third pole $p_3$ according to the present invention.

By referring to the schemes of FIGS. 5 and 6, according to the present invention, the third pole $p_3$ of the loop's transfer function is established by modifying the internal circuit of the VCO block 16, which typically comprises an input voltage-to-current converting stage 20 followed by a common ring oscillator 22.

According to the invention, the third pole $p_3$ is generated by connecting a capacitance C1 between the output node 24 of the voltage-to-current converting stage 20 of the VCO circuit 16 and a common ground node 26 of the circuit, and controlling the value of the capacitance C1 by the use of the same digital/analog converter (DAC) 28 that controls the time constant $\tau$ of the low pass loop filter 14, which is functionally connected in cascade to the charge pump circuit 12.

By implementing the low pass filter 14 of the PLL loop as well as the capacitance C1 in a fully integrated form, the noise that is injected into the loop is minimized with positive effects in that the jitter is kept low.

By connecting the capacitance C1 to the output 24 of the voltage-to-current (V/I) converting input stage 20 of the VCO circuit 16, the noise is sensibly reduced because the capacitance C1 also filters disturbances coming from the V/I circuit 20 and, in the depicted example, from the supply rails 30 through the current generator 32, which provides a regulated drive current to the VCO 16. Thus, the filtering effect of the capacitance C1 further reduces the jitter.

By using the same digital/analog converter DAC 28 to control the value of the capacitance C1 and the time constant $\tau$ of the low pass loop filter 14, the $\omega_0$ of the PLL may be changed while keeping the damping factor $\xi$ perfectly constant. In practice, the DAC 28 controls the frequency separation between the $1/\tau$ zero and the pole $p_3$, thus optimizing the performance of the PLL.

Clearly, changes may be made to the circuit as described and illustrated herein without, however, departing from the scope of the present invention. In particular, any means may be used to control the time constant in the low pass loop filter and the value of the capacitance added in the VCO block.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A fully integrable phase locked loop comprising:

cascade connected circuit elements including a phase detector, a charge pump, a low pass filter, and a voltage controlled oscillator having a voltage-to-current converting input stage, said input stage having an output node;

a phase control feedback line for providing feedback within said phase locked loop;

a digital/analog converter for controlling a time constant of said low pass filter; and capacitive means for generating a third pole in a transfer function of said phase locked loop, wherein said capacitive means are constituted by a capacitance connected between said output node of said voltage-to-current converting input stage of said voltage controlled oscillator and a ground node, a value of said capacitance being controlled by said digital/analog converter, which also controls said time constant of said low pass filter.

2. The phase locked loop according to claim 1 and wherein said oscillator is controlled by a sum current, said sum current comprising a sum of an output current from said voltage-to-current converting input stage and a regulation current, said regulation current being generated by a current mirror circuit capable of forcing said sum current on a control node of said oscillator.

3. A method of generating a third pole in a transfer function of a phase locked loop, said phase locked loop having a charge pump circuit, a low pass loop filter having a time constant that is controlled by a digital/analog converter, and a voltage controlled oscillator having a voltage-to-current converting input stage, said input stage having an output node;

said method comprising the steps of:

connecting a capacitance between said output node of said voltage-to-current converting input stage of said voltage controlled oscillator and a common ground node of said phase locked loop; and controlling a separation frequency between said third pole and a zero of said transfer function determined by a reciprocal of said time constant by controlling a value of said capacitance by using said digital/analog converter which controls said time constant of said low pass filter.

4. An oscillator circuit comprising:

a low pass filter having a time constant controlled by a time constant controller; and a voltage controlled oscillator coupled with said low pass filter, said voltage controlled oscillator having an internal circuit element establishing a pole in a transfer function of said circuit, said time constant controller being coupled to said circuit element to control a frequency of said pole.

5. An oscillator circuit as claimed in claim 4 wherein said circuit element is connected so as to filter a signal within said voltage controlled oscillator.

6. An oscillator circuit as claimed in claim 4 wherein said time constant provides a frequency of a zero in said transfer function, and said time constant controller is coupled to said circuit element to control said frequency of said pole to substantially track said frequency of said zero.

7. An oscillator circuit as claimed in claim 6 further comprising:
 a phase detector coupled with said low pass filter; and
 a feedback loop providing a feedback path between said voltage controlled oscillator and said phase detector.

8. An integrable phase locked loop comprising:
 a phase detector;
 a low pass filter coupled with said phase detector, said low pass filter having a time constant which is adjustable by a time constant controller;
 a voltage controlled oscillator coupled with said low pass filter, said voltage controlled oscillator having an input stage,
 a feedback path coupling said voltage controlled oscillator and said phase detector; and
 a circuit element establishing a frequency of a pole in a transfer function of said phase locked loop, said circuit element being coupled with an output node of said input stage, said time constant controller being coupled with said circuit element so that said frequency of said pole is controlled by said time constant controller.

9. An integrable phase locked loop as claimed in claim 8 further comprising a charge pump coupled with said phase detector for amplifying an output signal of said phase detector.

10. An integrable phase locked loop as claimed in claim 8 wherein said circuit element is capable of filtering a signal within said voltage controlled oscillator.

11. An integrable phase locked loop as claimed in claim 8 wherein said input stage is a voltage to current converter.

12. An integrable phase locked loop as claimed in claim 11 wherein said voltage controlled oscillator includes a ring oscillator coupled to said voltage to current converter.

13. An integrable phase locked loop as claimed in claim 8 wherein said time constant controller is coupled to control said frequency of said pole so that said frequency of said pole will substantially track a frequency of a zero established by said time constant.

14. An integrable phase locked loop as claimed in claim 13 wherein said circuit element includes a capacitive element.

15. An integrable phase locked loop as claimed in claim 13 wherein said circuit element is a capacitive element connected between said output node and a common ground.

16. An integrable phase locked loop as claimed in claim 13, wherein said pole frequency and said zero frequency are on opposite sides of an operating frequency of said phase locked loop.

17. An integrable phase locked loop as claimed in claim 13, wherein said transfer function has a damping factor, and wherein said pole frequency and said zero frequency are far enough apart so that said damping factor is sufficiently large to enable satisfactory phase tracking of frequencies near said operating frequency, but wherein said pole frequency and said zero frequency are close enough together so as to obtain satisfactory rejection of frequencies substantially above said operating frequency.

18. An integrable phase locked loop as claimed in claim 17, wherein said damping factor is at least 0.7.

19. An integrable phase locked loop as claimed in claim 13 wherein said time constant controller is a digital to analog converter.

20. An integrable phase locked loop comprising:
 a phase detector for producing a phase output signal;
 a charge pump for amplifying said phase output signal;
 a low pass filter coupled with said charge pump, said low pass filter having a time constant, said time constant being adjustable by a time constant controller;
 a voltage controlled oscillator in cascade with said low pass filter, said voltage controlled oscillator having a voltage-to-current converting input stage;
 a feedback network coupling said voltage controlled oscillator and said phase detector; and
 a capacitance coupled between an output of said input stage and a common ground, said capacitance being controllable by said time constant controller.

21. An integrable phase locked loop as claimed in claim 20, wherein said time constant controller controls said capacitance so as to cause a frequency of a pole created in a transfer function of said phase locked loop to substantially track a frequency of a zero in said transfer function produced by said time constant.

22. An integrable phase locked loop as claimed in claim 21 wherein said time constant controller is a digital to analog converter.

23. An integrable phase locked loop comprising:
 a phase detector;
 a low pass filter coupled with said phase detector, said low pass filter having a time constant which is adjustable by a time constant controller;
 a voltage controlled oscillator coupled with said low pass filter, said voltage controlled oscillator having an input stage;
 a feedback path coupling said voltage controlled oscillator and said phase detector; and
 means for producing a pole in a transfer function of said phase lock loop at a frequency which is controlled by said time constant controller, said pole producing means being coupled with an output of said input stage.

24. An integrable phase locked loop as claimed in claim 23 wherein said time constant controller is coupled with said pole producing means to control said pole frequency so that said pole frequency will substantially track a frequency of a zero established by said time constant.

25. An integrable phase locked loop as claimed in claim 23 wherein said input stage is a voltage to current converter and said pole producing means is a capacitance coupled with an output of said voltage to current converter.

26. A method for generating a pole in a transfer function of a circuit having a low pass filter coupled with a voltage controlled oscillator comprising the steps of:
 coupling a circuit element capable of producing a pole in a transfer function of said circuit with an output of an input stage of said voltage controlled oscillator to produce said pole; and
 controlling a value of said circuit element with a time constant controller which controls a time constant of said low pass filter.

27. The method as claimed in claim 26 wherein said circuit also has a phase detector coupled with said low pass filter and a feedback path coupling said voltage controlled oscillator with said phase detector, and wherein said value of said circuit element is controlled so that a frequency of said pole substantially tracks a frequency of a zero in said transfer function of said circuit produced by said time constant of said low pass filter.

28. A method for controlling a frequency of a pole produced in a transfer function of a phase lock loop having a low pass filter and a voltage controlled oscillator comprising the steps of:

establishing said pole internal to said voltage controlled oscillator; and controlling said frequency of said pole with a means also used to control a time constant of said low pass filter.

29. The method as claimed in claim 28 wherein said frequency of said pole is controlled so that said frequency of said pole substantially tracks a frequency of a zero established by said time constant in said transfer function of said phase lock loop.

* * * * *